(12) United States Patent
Ma

(10) Patent No.: US 6,614,051 B1
(45) Date of Patent: Sep. 2, 2003

(54) DEVICE FOR MONITORING SUBSTRATE CHARGING AND METHOD OF FABRICATING SAME

(75) Inventor: Shawming Ma, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/144,056

(22) Filed: May 10, 2002

(51) Int. Cl.[7] .............................................. H01L 23/58
(52) U.S. Cl. ..................... 257/48; 257/428; 438/10; 438/14; 438/11; 230/61; 324/769
(58) Field of Search ................... 257/48, 428; 438/10, 438/14, 11; 230/61; 324/769

(56) References Cited

U.S. PATENT DOCUMENTS

| 5,186,718 A | 2/1993 | Tepman et al. ............ 29/25.01 |
| 5,315,145 A | 5/1994 | Lukaszek ................... 257/379 |
| 5,534,108 A | 7/1996 | Qian et al. ................ 156/643.1 |
| 5,721,430 A | 2/1998 | Wong ......................... 250/339 |
| 5,959,309 A | 9/1999 | Tsui et al. .................... 257/48 |
| 6,060,895 A | 5/2000 | Soh et al. .................... 324/760 |
| 6,113,731 A | 9/2000 | Shan et al. .................. 156/345 |
| 6,144,037 A | 11/2000 | Ryan et al. ............... 250/492.2 |

FOREIGN PATENT DOCUMENTS

| JP | 11-238774 | * 8/1999 | ........... H01L/21/66 |

* cited by examiner

Primary Examiner—Sara Crane
Assistant Examiner—Junghwa Im
(74) Attorney, Agent, or Firm—Moser, Patterson & Sheridan; Joseph Bach

(57) ABSTRACT

A charge monitoring device comprising one or more capacitor-resistor pairs. The one or more capacitor-resistor pairs comprise a resistor and a capacitor connected in series. The capacitor comprises a ferroelectric charge storage layer. A method of forming the charge storage device is also provided.

The charge monitoring device may be used to measure charge accumulation on a semiconductor wafer. The method comprises the steps of positioning a charge monitoring device in a semiconductor wafer production chamber, initiating a manufacturing process in the chamber and measuring the charge accumulation on the charge monitoring device.

16 Claims, 18 Drawing Sheets

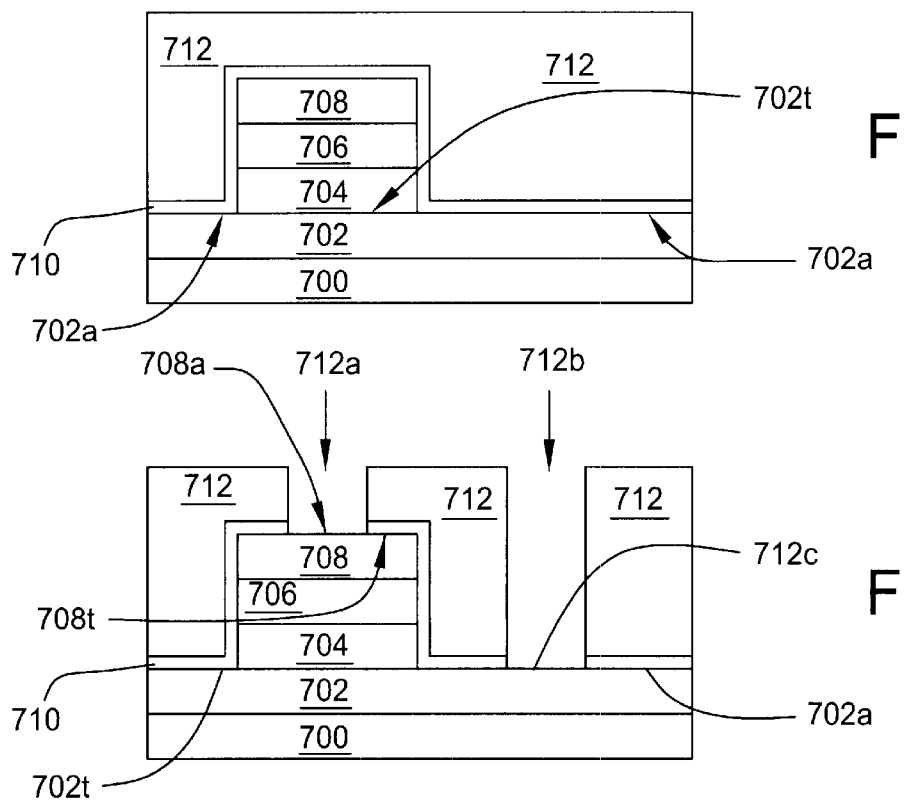
FIG. 7d
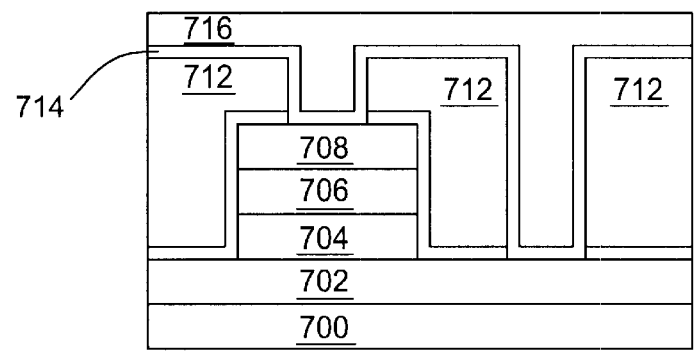
FIG. 7e
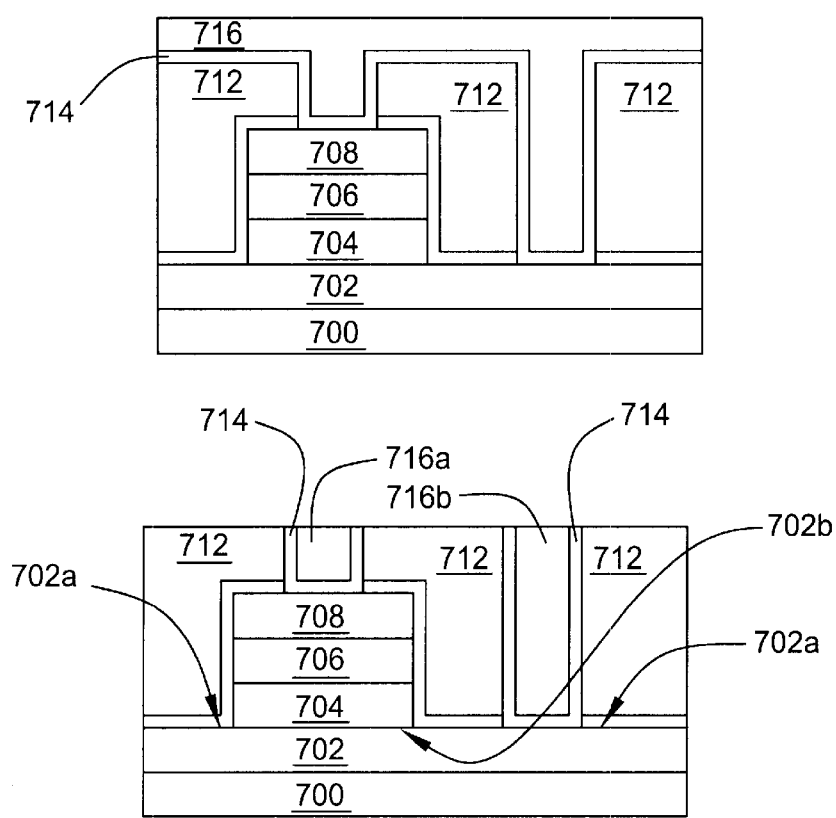
FIG. 7f
FIG. 7g

DEVICE FOR MONITORING SUBSTRATE CHARGING AND METHOD OF FABRICATING SAME

BACKGROUND OF THE INVENTION

1. Field of the Invention

The invention relates to an apparatus for monitoring the charging of a substrate. More particularly, the invention relates to a device for monitoring charging damage of substrates during semiconductor processing and a method of fabricating such a device.

2. Description of the Background Art

Charged beam and plasma-assisted processes such as plasma enhanced chemical vapor deposition (PECVD), inductive coupled plasma (ICP), and reactive ion etching (RIE), and ion implantation are commonly used in semiconductor processing to enhance the deposition of films or layers on a wafer or to assist in the etching of various material layers.

Unfortunately, these processing methods often cause charges to accumulate on material surfaces and layers that are processed, often to the extent of causing damage to these surfaces and layers. For example, non-uniformities in the plasma or beam may result in the accumulation of high levels of charge on various material layers, resulting in dielectric breakdown of dielectric layers, and thereby compromising the performance of structures being created or processed.

In order to monitor the charge profiles on processed wafers (and thereby and potential damage resulting from processing), the semiconductor industry has employed various means including electrical erasable programmable read only memory (EEPROM) transistor devices. FIG. 1 shows a schematic cross-section of an EEPROM transistor device for measuring charging. The EEPROM transistor device comprises a semiconductor substrate 22 and an oxide layer 24 disposed atop the semiconductor substrate 22. A charge collection electrode 10 is disposed atop the oxide layer 24 and coupled to a control electrode 12. Charge that develops on charge collection electrode 10, upon exposure to, for example, a plasma, is conducted to control electrode 12. Floating gate 14 receives charge from control electrode 12. Due to the asymmetry in the shapes of control electrode 12 and gate 14, electrons flow more easily from control electrode 12 into gate 14 than in the reverse direction. The threshold voltage required for current flow between a source region 16 and a drain region 18 is a function of the amount of charge that has been developed on the charge collection electrode 10 as well as the resistance of a resistive path 20 between the semiconductor substrate 22 and the charge collection electrode 10. In order to determine the extent of wafer charging that occurs during a semiconductor process, the EEPROM is placed in a chamber and, as part of a diagnostic wafer, exposed to the process in a "test run" situation. The EEPROM transistor device is subsequently removed from the chamber and the degree of charging is calculated based upon the change in threshold voltage as well as the resistance value of the resistive path.

However, a number of drawbacks are associated with the EEPROM transistor devices. First, the voltage sensing region is limited to a maximum about 20 volts. For applied voltages greater than this value, saturation occurs, and the device is not capable of distinguishing greater degree of charging. Similarly, voltages below about 0.5 to about 1.0 volts are too small to be accurately detected. Second, the EEPROM device is sensitive to ultraviolet (UV) radiation. This is problematic in that if the EPPROM device is placed in an environment containing ultraviolet radiation, as is typically the case for plasma-assisted processes, the reading provided by the device may not be a completely accurate reading that is based solely upon effects of charging. Another serious drawback on the EEPROM device is its inherent complexity. The EEPROM is a transistor device that requires numerous time consuming steps, including masking, ion implantation, among others to create.

Therefore, a need exists for a charge monitoring device that is capable of operating over a wide range of charging conditions, is not sensitive to UV radiation, and is easy to fabricate.

SUMMARY OF THE INVENTION

The disadvantages associated with prior art are overcome by the present invention of an apparatus for a charge monitoring device comprising one or more capacitor-resistor pairs, wherein the one or more capacitor-resistor pairs comprise a resistor and a capacitor connected in series. The capacitor comprises a ferroelectric charge storage layer.

Also provided is a method of forming a charge monitoring device comprising the steps of forming a bottom electrode layer on a substrate, forming a ferroelectric charge storage layer atop the bottom electrode layer, and forming a top electrode layer atop the ferroelectric charge storage layer. The method further comprises forming a hard mask layer atop the top electrode layer, removing portions of the hard mask layer, and removing portions of the ferroelectric charge storage layer as well as portions of the top electrode layer thereon. This exposes portions of the top surface of the bottom electrode layer and allows other portions to remain in contact with the ferroelectric charge storage layer. The method further comprises forming a dielectric material layer atop the portions of the top surface of the bottom electrode layer and atop the hard mask layer and forming a first opening in the dielectric layer above the other portions of the top surface of the bottom electrode layer, the first opening of sufficient depth to expose portions of the top surface of the hard mask layer. The method further comprises forming a second opening in the dielectric layer above the portions of the top surface of the bottom electrode layer, the second opening of sufficient depth to expose a segment of the top surface of the bottom electrode layer. Conductive material is then provided to the first opening and the second opening.

Also provided is a method of measuring a charge accumulation on a semiconductor wafer. The method comprises the steps of positioning a charge monitoring device in a semiconductor wafer production chamber. The charge monitoring device comprises one or more capacitor-resistor pairs having a threshold switching voltage. The one or more capacitor-resistor pairs, comprise a capacitor in series with one or more resistors. The capacitor comprises a ferroelectric charge storage layer. The method further comprises initiating a manufacturing process in the chamber and measuring the charge accumulation within the ferroelectric charge storage layer of the charge monitoring device.

BRIEF DESCRIPTION OF THE DRAWINGS

The teachings of the present invention can be readily understood by considering the following detailed description in conjunction with the accompanying drawing, in which:

FIGS. 7a–k depict schematic cross-sectional illustrations of one embodiment of the subject charge monitoring device during the various steps of its construction;

DETAILED DESCRIPTION OF THE INVENTION

Figure 1:
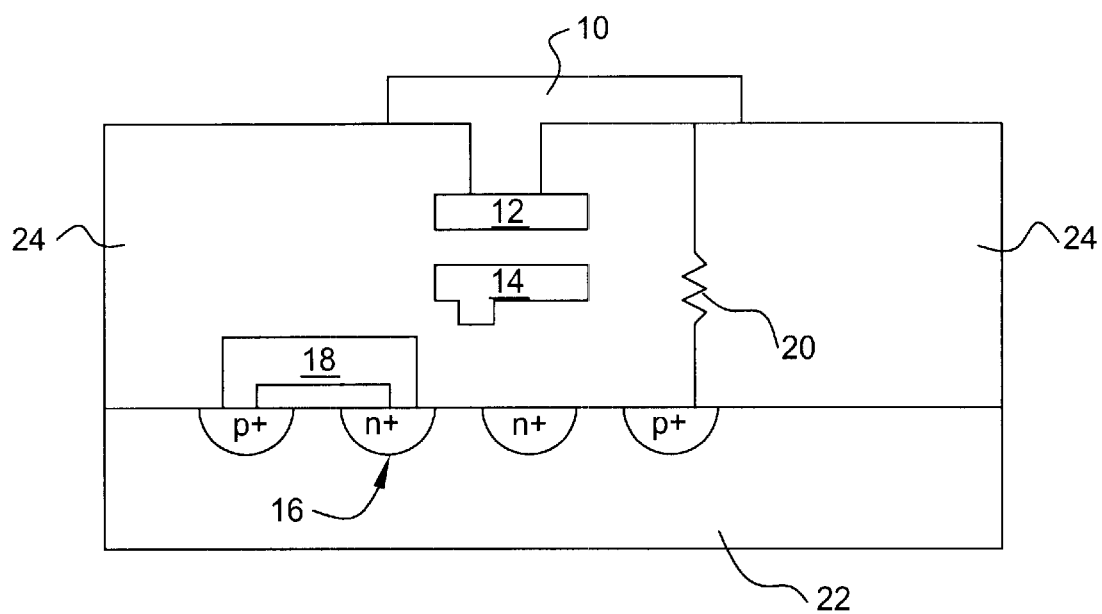
FIG. 1 depicts a schematic cross-sectional illustration of a prior art erasable programmable read only memory (EEPROM) transistor device.
Figure 2:
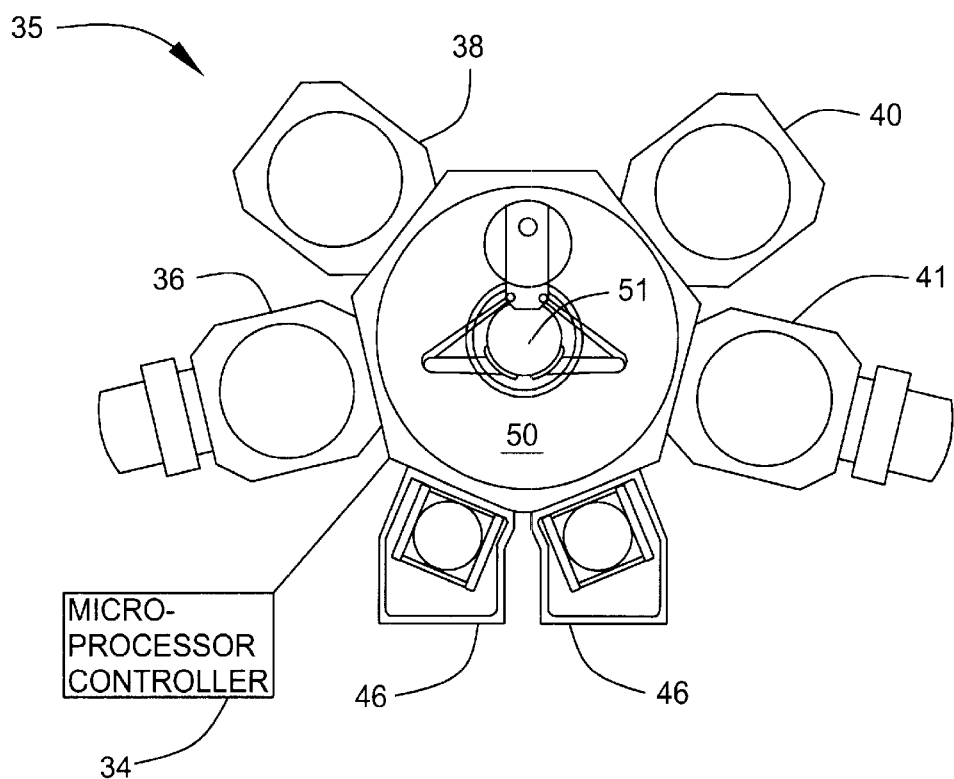
FIG. 2 depicts a schematic illustration of a semiconductor fabrication device that can be used to practice embodiments described herein.

FIG. 2 is a schematic representation of an integrated processing system 35 that can be used to perform integrated circuit fabrication. This apparatus typically comprises process chambers 36, 38, 40, 41, load-lock chambers 46, a transfer chamber 50, a microprocessor controller 54, along with other hardware components such as power supplies (not shown) and vacuum pumps (not shown). An example of such a integrated processing system 35 is a CENTURA® System, commercially available from Applied Materials, Inc., Santa Clara, Calif.

Details of the integrated processing system 35 used in the present invention are described in commonly assigned U.S. Pat. No. 5,186,718, entitled, "Staged-Vacuum Substrate Processing System and Method", issued on Feb. 16, 1993, and is hereby incorporated by reference. The salient features of this system 35 are briefly described below.

The integrated processing system 35 includes a transfer chamber 50, containing a transfer robot 51. The transfer chamber 50 is coupled to load-lock chambers 46 as well as a cluster of process chambers 36, 38, 40, 41.

Process chambers 36, 38, 40, 41 may include, for example, one or more of the following: plasma assisted chemical vapor deposition (PECVD) chambers, inductive coupled plasma (ICP) chambers, sputtering chambers, or other deposition chambers commonly used for the deposition of various films for semiconductor devices. Furthermore, process chambers 36, 38, 40, 41 may include other commonly used semiconductor process chambers, such as, for example, reactive ion etching (RIE) chambers.

Figure 3:
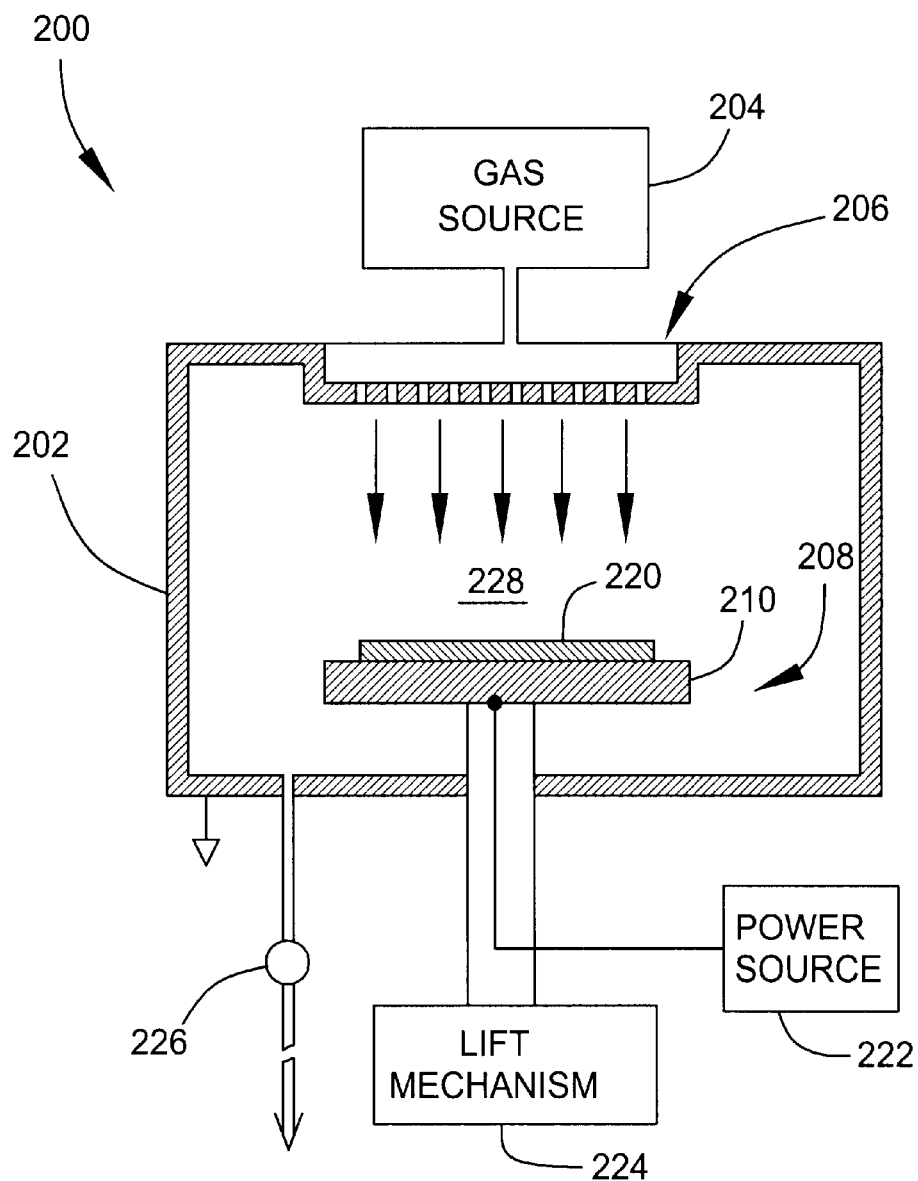
FIG. 3 depicts a schematic illustration of an etch chamber.

FIG. 3 depicts a schematic illustration of a cross-sectional view of an exemplary process chamber, i.e., an etch process chamber 200, that could be used in the system of FIG. 2. The chamber 200 comprises a vacuum chamber 202, a gas source 204, a pumping system 226 and a power source 222. Gas source 204 is coupled to a showerhead 206 within the chamber 202. The showerhead 206 distributes process gases uniformly above a substrate 220. The ionized process gases etch (remove) material from the substrate in a process known as reactive ion etching. Inside the vacuum chamber 202 may be a vertically movable pedestal 208. A lift mechanism 224 is coupled to the pedestal 208 to position the pedestal 212 relative to the showerhead 206. Alternatively, the pedestal 208 may be stationary.

A substrate 220 is supported within the chamber 202 by the pedestal 208, and is generally disposed at a certain distance from the showerhead 206. The pedestal 208 may be moved along a range of vertical motion within the chamber 202 by the lift mechanism 216. The pedestal 208 comprises a chuck 210 for retaining the substrate 220 on the pedestal. The chuck may be a vacuum chuck, an electrostatic chuck, a mechanical clamp, and the like.

The power source 222 may comprise a DC source, a radio frequency (RF) source or a DC-pulsed source. Typically, the source 222 is an RF source. When power is applied to the pedestal 208, a plasma is formed from the process gas in the reaction zone 228, comprising ions, electrons and neutral atoms. If the target power source 222 is an RF source, then the chamber walls are typically grounded and the voltage at the pedestal 208 varies relative to the walls at a radio frequency, typically 13.56 MHz. In this case, electrons in the plasma accumulate at the substrate 220 to create a self-bias voltage that negatively biases the substrate 220.

The electric field accelerates the process gas ions toward the substrate 220 for reacting with materials on the substrate 220.

The etch chamber 200 may comprise additional components for improving the etching process. These additional components include, for example, a magnetic sub-assembly positioned proximate the side walls of the chamber for creating a magnetic field within the chamber. An example of such a chamber is the eMxP, MxP, or eMAX chambers commercially available from Applied Materials, Inc., Santa Clara, Calif. Details of such etch chambers have been disclosed in commonly-assigned U.S. Pat. No. 5,534,108, issued Jul. 9, 1996, and U.S. Pat. No. 6,113,731, issued Sep. 5, 2000, which are herein incorporated by reference.

During the etch process, the plasma formed from the process gas in the etch chamber 200 causes charges to accumulate on various material surfaces and layers that are present on substrate 220, often to the extent of causing damage to these surfaces and layers. For example, non-uniformities in the plasma may result in the accumulation of high levels of charge on various dielectric material layers, resulting in dielectric breakdown of the material layers, and thereby compromising the performance of structure being processed. Furthermore, undesirable quantities of charge may develop on the various parts within and interior surfaces of etch chamber 200. These charges may eventually be transferred to material layers that are undergoing etch processing, again possibly resulting in adverse effects to these material layers.

In order to monitor the extent of charging that is occurring within the chamber 200 and, more specifically, a charge monitoring device 300 is positioned in the chamber 200 on the pedestal 208 in place of substrate 220 and a process sequence is initiated.

The chamber of FIG. 3 is illustrative of the type of chamber the invention may find use. As shall become evident from the following disclosure, the invention, a device for monitoring substrate charging, may find use in any type of plasma chamber including, PVD, PECVD, inductively coupled etch chambers, plasma annealing chambers, and the like.

CHARGE MONITORING DEVICE

Figure 4:
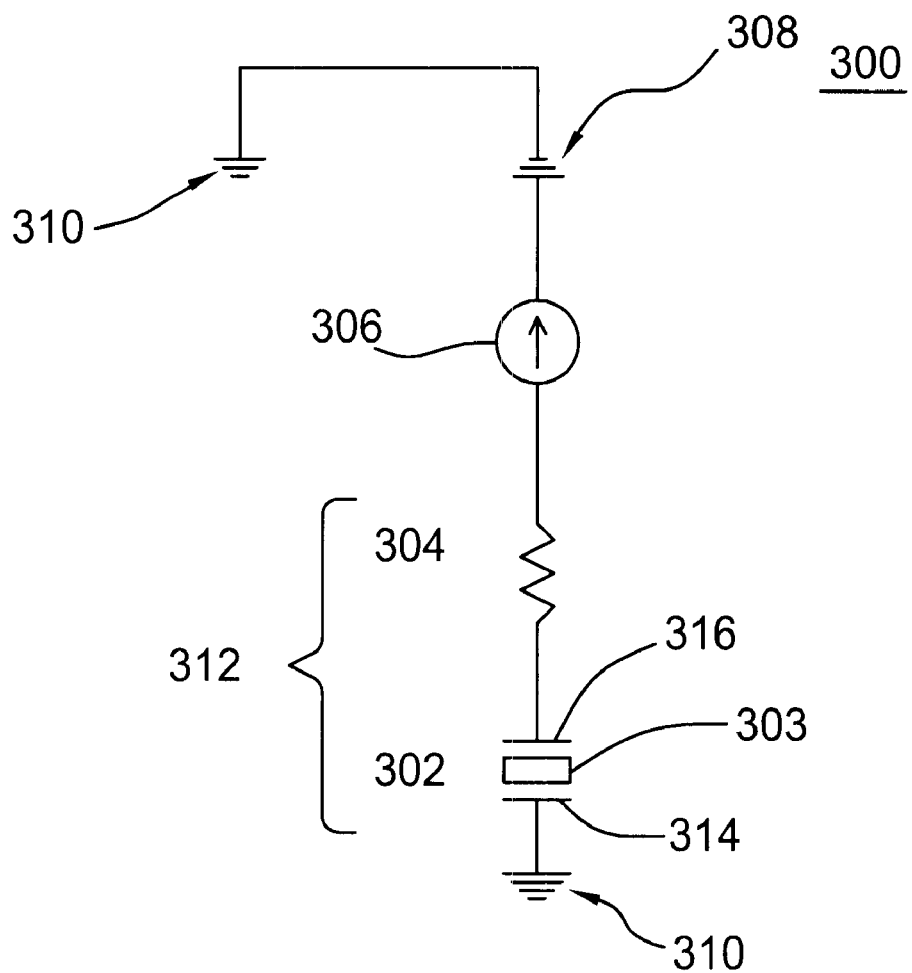
FIG. 4 depicts a circuit diagram representation of a charge monitoring device of the present invention.

FIG. 4, depicts a schematic diagram representation of charge monitoring device 300. Charge monitoring device comprises a resistor 304 and a capacitor 302 connected in series. The resistor 304 and a capacitor 302 connected in series form a capacitor-resistor pair 312. Charge sensing device 300 further comprises a charge collector 306 (also referred to as a charge collecting antenna) also connected to the resistor-capacitor pair 312. When a voltage or charge source 308, such as a plasma, is brought into contact with the device 300, charge will flow from the source 308 to the charge collector 306, through the resistor-capacitor pair 312, thereby charging the capacitor 302. The circuit path is completed via the connection of the capacitor to ground 310.

Although it is within the scope of the present invention for the charge monitoring device 300 to have a single capacitor-resistor series pair 312 in series with charge collector 308, the operation of the device 300 is improved by having a plurality of capacitor-resistor pairs 312. Such embodiment is described in further detail below with respect to FIG. 6.

Capacitor 302 may be, for example, a parallel plate capacitor, or capacitor 302 may have a more complex geometry, such as an interdigitated capacitor. Capacitor 302 generally comprises a bottom electrode layer 314 and a top electrode layer 316. A ferroelectric charge storage layer 303 is disposed between the electrode layers 314 and 316. Ferroelectric charge storage layer 303 may be, for example, a ceramic material, a polymeric material, a ceramic polymer composite material, or combinations thereof. In one illustrative embodiment, the ferroelectric charge storage layer 303 is a ceramic material.

The ferroelectric charge storage layer 303 generally comprises an oxide or nitride of one or more elements including at least one element selected from the group consisting of oxygen, barium, strontium, titanium, lead, lanthanum, zirconium, titanium, magnesium, potassium, niobium, lithium, calcium, bismuth, and tantalum.

The ferroelectric charge storage layer 303 may, for example, comprise a crystalline oxide material containing corner sharing octahedra of $O^{2-}$ ions. The ferroelectric charge storage layer 303 may, for example, comprise a material with a perovskite crystal structure. Illustratively, the ferroelectric charge layer 303 comprises a material selected from the group consisting of barium titanate, barium strontium titantate, lead titanate, lead lanthanum zirconate titanate, lead zirconate titanate, lead magnesium niobate, potassium niobate, potassium sodium niobate, calcium titantate, bismuth titanate, lead bismuth niobate, lithium niobate, lithium tantalate, and combinations thereof. However, the ferroelectric charge layer 303 may include materials such as, for example, potassium dihydrogen phosphate, triglycine sulfate, sodium potassium tantalate terahydrate, polyvinylydene fluoride, trifluoroethylene, polyvinylydene fluoride copolymers, as well as various ceramic polymer composites, and combinations of the aforementioned materials. In the case of ceramic polymer composites, the composite may be structured as, for example, a polymer matrix with discrete ceramic inclusions, a ceramic matrix with discrete polymer inclusions, layered structures, etc.

Ferroelectric charge material in layer 303 is characterized by having reversible spontaneous polarization. Spontaneous polarization typically arises from non-centrosymmetric arrangements of charged species which gives rise to a permanent electric dipole moment. Adjacent dipoles within the material tend to orient in the same direction to form a ferroelectric domain.

Figure 5:
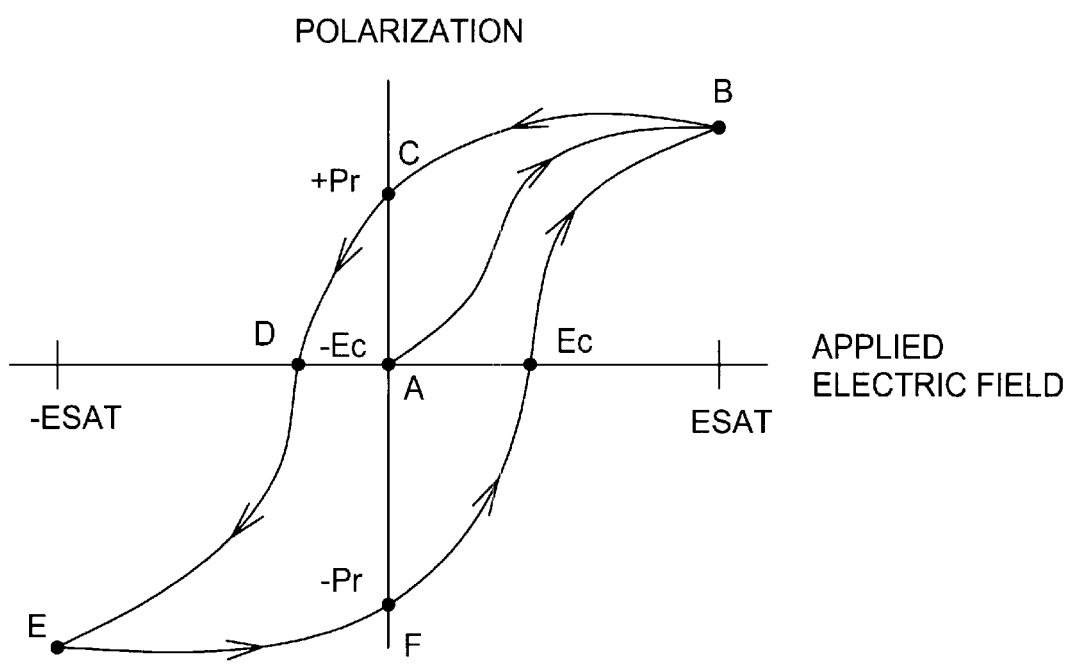
FIG. 5 illustrates the polarization behavior of the ferroelectric charge storage layer that may be used to practice embodiments described herein.

Ferroelectric charge storage layer 303 generally responds in a non-linear manner to an applied electric field as illustrated in FIG. 5. FIG. 5 depicts a graphical relationship between polarization and applied electric field, as is known in the art of ferroelectric materials. Beginning at point A, as an electric field applied to ferroelectric charge material 304 is increased, the polarization of ferroelectric charge storage layer 303 increases. Ferroelectric domains which are aligned with the applied electric field grow at the expense of other domains. Under an applied electric field of magnitude $E_{sat}$, all domains are aligned with the applied electric field, as illustrated by point B. If the applied electric field is then removed, the ferroelectric domains do not all reorient to their original configuration and a remnant polarization, Pr remains, as indicated at point C. In order to bring the ferroelectric charge material 304 to its original polarization state, an electric field with a polarity opposite to the original electric field must be applied, as per point D. This field has a magnitude, −Er, and is referred to the coercive field.

The polarization of ferroelectric charge storage layer 303 may be continuously altered by changing the polarity of the applied electric field. The polarization of the ferroelectric charge storage layer 303, may, for example, follow the path from A to B to C to D to E to F by applying an electric field greater to or equal in magnitude than $+E_{sat}$ and removing the applied field. This generates a polarization state +Pr. This may be followed by applying an opposite electric field greater to or equal in magnitude than $-E_{sat}$ and removing the field to generate a polarization state −Pr.

Figure 6:
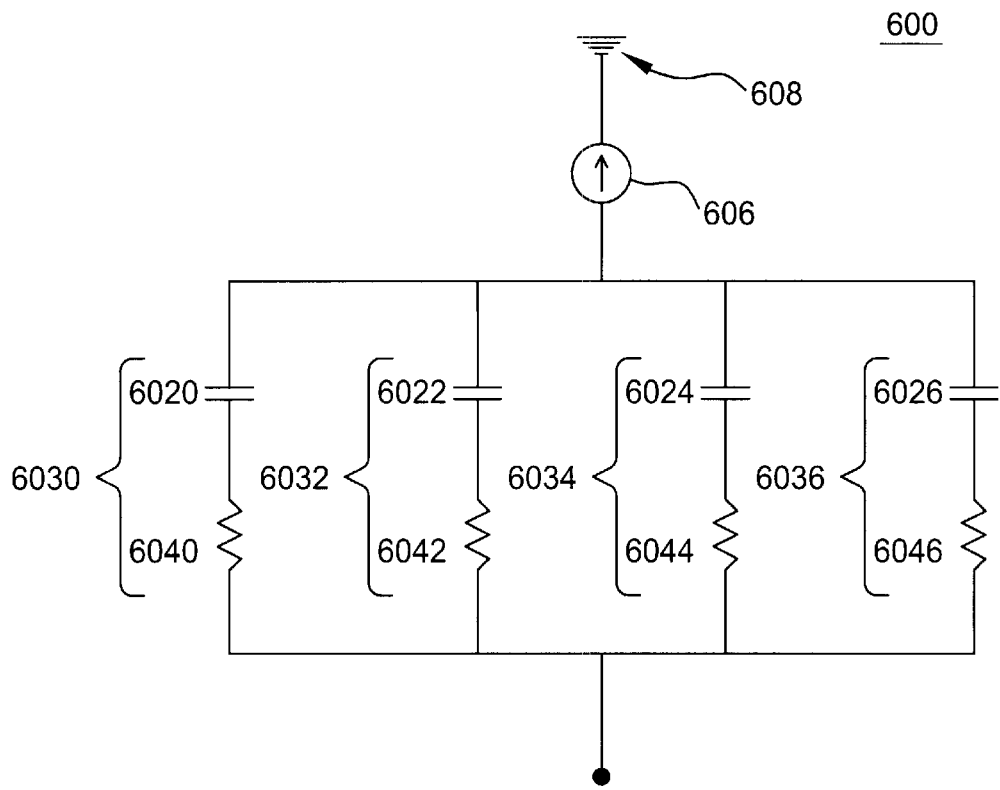
FIG. 6 depicts a circuit diagram representation of a charge monitoring device that may be used to practice embodiments described herein.

Referring to FIG. 6, charge monitoring device 600 comprises first capacitor 6020 connected in series to first resistor 6040 to form a first resistor-capacitor pair 6030. Similarly, second capacitor 6022 is connected in series to second resistor 6042 to form a second resistor-capacitor pair 6032, third capacitor 6024 is connected in series to third resistor 6044 to form a third resistor-capacitor pair 6034, and fourth capacitor 6026 is connected in series to fourth resistor 6046 to form a fourth resistor-capacitor pair 6036. In this embodiment of the present invention, first resistor-capacitor pair 6030, second resistor-capacitor pair 6032, third resistor-capacitor pair 6034, and fourth resistor-capacitor pair 6036 are connected in parallel with each other. While FIG. 6 depicts a circuit with four resistor-capacitor pairs, it is within the scope of the present invention to use more or less than four pairs. Furthermore, while FIG. 6 depicts capacitor-resistor pairs consisting of only one resistor in series with a capacitor, one skilled in the art will recognize that using multiple resistors in series with a capacitor in place of a single resistor in series with a capacitor is electrically equivalent. Furthermore, multiple capacitors arranged in parallel and coupled to a single resistor could also be used.

In the manner described above, charge monitoring device 600 comprises an array of resistor-capacitor pairs 6030, 6032, 6034, 6036. The resistor capacitor pairs 6030, 6032, 6034, 6036 are connected to one another in parallel. If charge monitoring device 600 is subject to charging from, for example, a plasma charge source 608, and the charge is then conducted to charge collector 606, the same voltage will then develop across each resistor-capacitor pair 6030, 6032, 6034, 6036.

Resistor-capacitor pairs 6030, 6032, 6034, 6036 have time constants (time constant is the product of the resistance and capacitance for the capacitor-resistor pair) that are preferably less than about one second to minimize the time required to charge and discharge the capacitors. The value of resistance are selected for resistors 6040, 6042, 6044, 6046 such that the charge provided from plasma charge source 608 is sufficient to switch the polarization state of the ferroelectric charge storage layer in some of the capacitors 6020, 6022, 6024, 6026, and insufficient to switch the polarization state of the ferroelectric charge storage layer in other capacitors 6020, 6022, 6024, 6026. In general, the resistance value of resistors 6040, 6042, 6044, 6046 varies with the material and the length of the resistor. In one illustrative embodiment, resistors 6040, 6042, 6044, 6046 comprise a polycrystalline silicon material and the length of the resistors defines the resistance value.

The capacitance value for capacitors 6020, 6022, 6024, 6026 is determined by the minimum polarization charge of the material and the thickness of the material. In general, the thickness of ferroelectric charge storage layer 303 is in the range of about 300 Å to about 5000 Å Angstroms with nominal value of about 1000 Å.

The charge collector 606 comprises an electrically conductive material. Preferably, charge collector 606 comprises an electrically conductive layer, wherein the electrically conductive layer is comprised of aluminum, copper, or combinations thereof.

PROCESS OF FORMING CHARGE MONITORING DEVICE

Figure 7A:
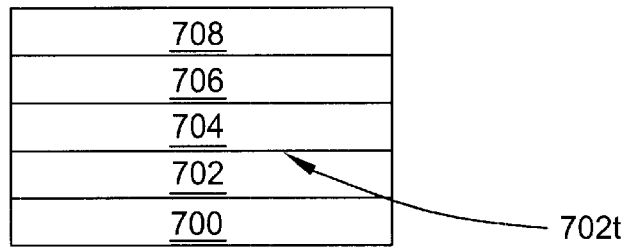

FIGS. 7a–7k depict the subject charge storage device during various construction steps. Referring to FIG. 7a, a substrate 700 is provided. In general, substrate 700 refers to any workpiece upon which film processing is performed. Depending upon the specific stage of processing, the substrate 700 may correspond to a silicon wafer, or other material layers, which have been formed on the substrate. For example, the substrate 700 may correspond to a silicon wafer with an oxide layer formed atop the silicon wafer. The substrate 700 may further comprise an adhesion layer, for example, a titanium-containing layer atop the oxide to facilitate the adhesion of layers formed atop the substrate 700.

Figure 9A:
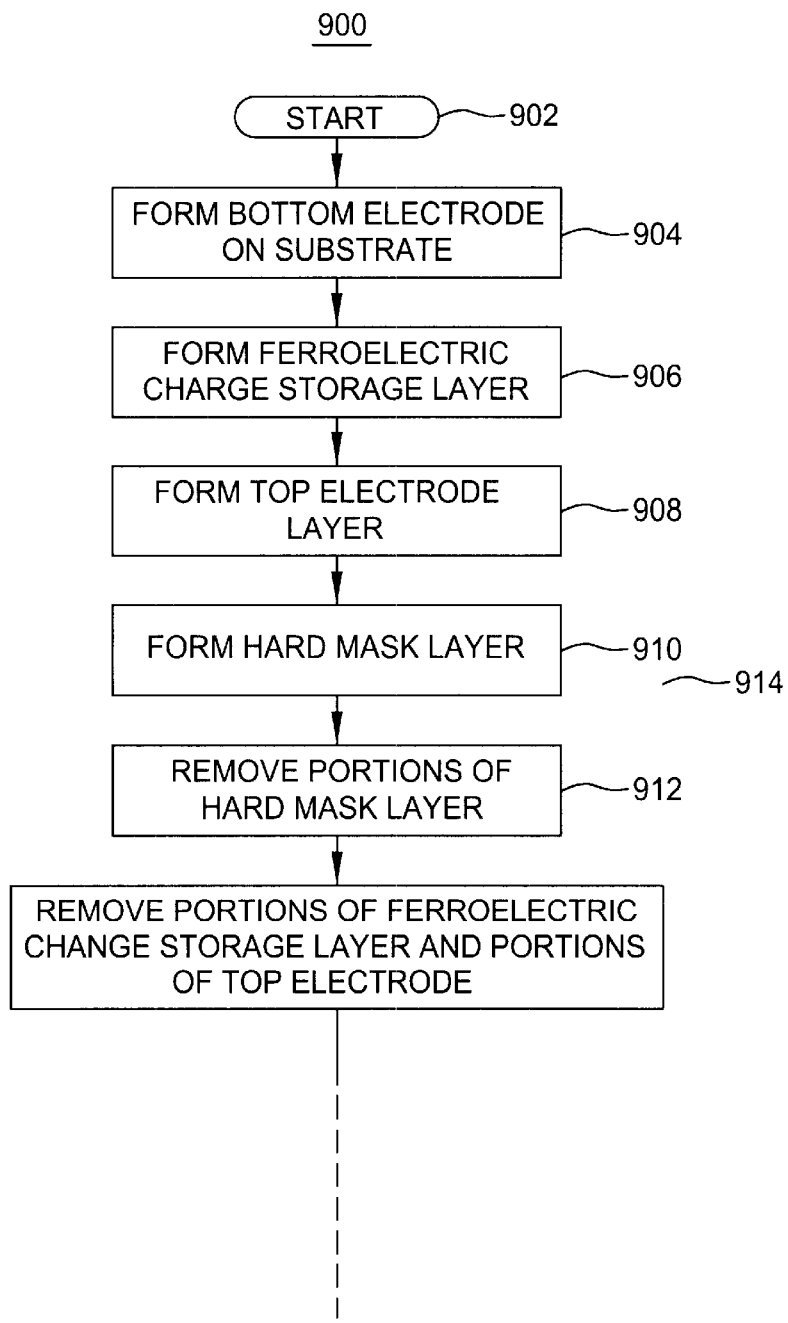
FIGS. 9a and 9b depicts a series of method steps for making the charge monitoring device whose construction is depicted in FIGS. 7a–k.
Figure 9B:
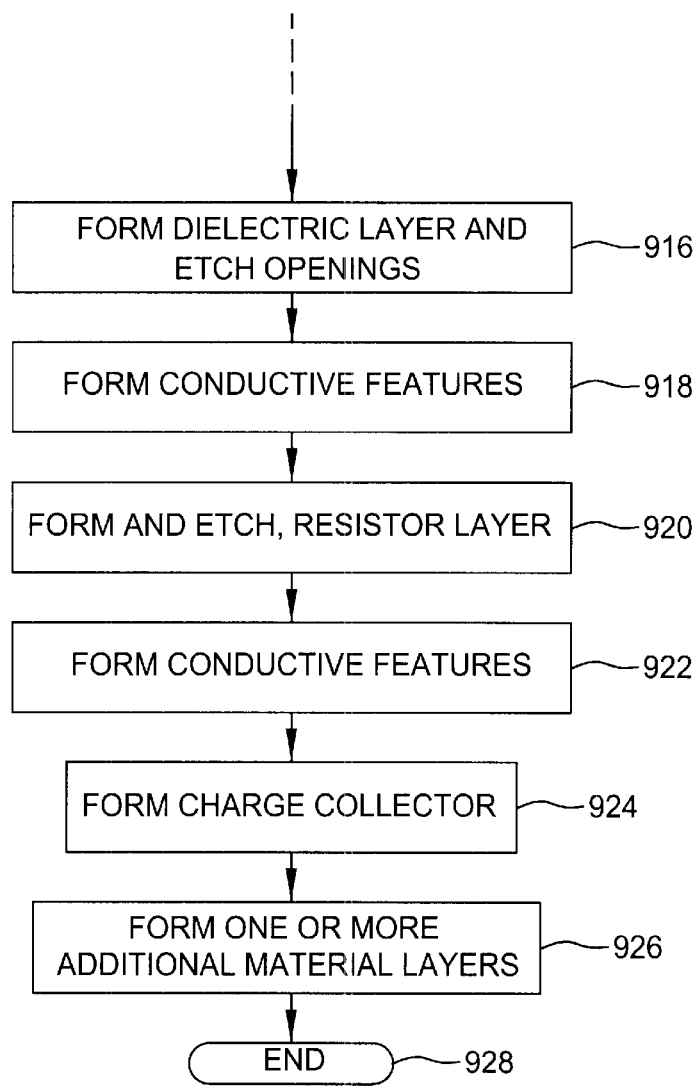

A method for forming the charge monitoring device is depicted in FIG. 9. Referring to FIG. 7 and FIGS. 9a and 9b, a series of method steps 900 begins at step 902 and proceeds to step 904 wherein a bottom electrode layer 702 is formed atop the substrate 700. Bottom electrode layer 702 may comprise, for example, iridium, platinum, or combinations thereof. Bottom electrode layer is preferably formed by sputter deposition, and has a thickness of about 1000 Angstroms. Bottom electrode layer has a top surface 702t. Referring to step 906, a ferroelectric charge storage layer 704 is formed atop bottom electrode layer 702. Bottom electrode layer 702 should preferably not react with the material used in the ferroelectric charge storage layer 704 in such a way as to degrade the material properties of either the bottom electrode layer 702 or the ferroelectric charge storage layer 704.

Ferroelectric charge storage layer 704 may, for example, be deposited by chemical vapor deposition (CVD) or other methods known to the art such as-the hydrolysis and condensation of organometallic precursors on the substrate (sol-gel processing), molecular beam epitaxy, laser ablation, and the like. In an illustrative embodiment, ferroelectric charge storage layer 704 is formed by a metalorganic chemical vapor deposition process (MOCVD) in which one or more organometallic precursors are reacted in vapor phase to form ferroelectric charge storage layer 704 on bottom electrode layer 702. In general, ferroelectric charge storage layer 704 comprises, for example, a ceramic material, a polymeric material, a ceramic-polymer composite material, or combinations thereof. Specific examples of materials that may comprise ferroelectric charge storage layer 704 are as described previously.

Top electrode layer 706 is formed atop ferroelectric charge storage layer 704, as shown in method step 908. Top electrode layer 706 may comprise, for example, iridium, platinum, or combinations thereof. Top electrode layer 706 is preferably formed by sputter deposition. Bottom electrode layer has a thickness of about 1000 Angstroms.

Figure 7B:
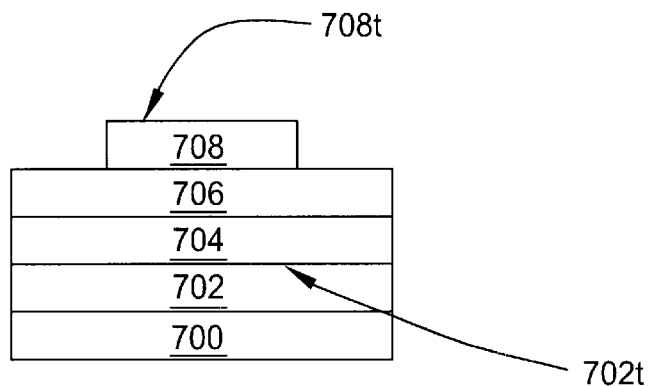

A hard mask layer 708 is formed atop top electrode layer 706, as shown in step 910. The hard mask layer may comprise, for example, titanium aluminum nitride and has a thickness of about 1500 Angstroms As shown in FIG. 7b and in step 912, hard mask layer 708 is patterned and etched to remove portions of hard mask layer 708. The removal process is conducted by methods known to the art, such as through photoresist processing, followed by use of a suitable etchant. The remaining portion of hard mask layer 708 has a top surface 708t.

Figure 7C:
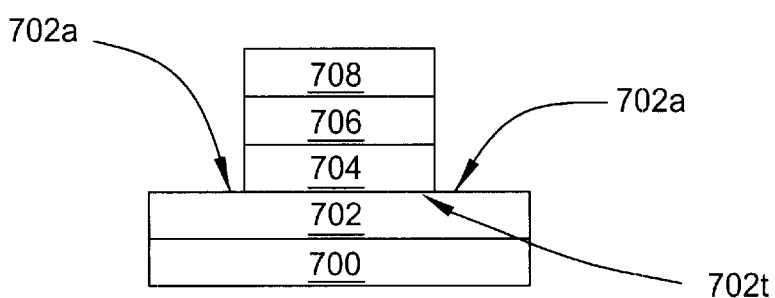

Portions of top electrode layer 706 and ferroelectric charge storage layer 704 are then removed to create a structure as shown in FIG. 7c and in step 914. By removing portions of ferroelectric charge storage layer 704 and portions of top electrode layer 706 thereon, portions 702a of top surface 702t are exposed, while other portions 702b remain in contact with ferroelectric charge storage layer 704.

Referring to FIG. 7d, an optional barrier/etch stop layer 710 is conformally deposited atop the portions 702a of the top surface 702t of the bottom electrode layer 702 and atop the hard mask layer 708. Layer 710 may comprise multiple sub-layers, such as, for example, aluminum oxide, aluminum nitride, and silicon nitride. In an illustrative embodiment, layer 710 is formed by depositing a sublayer of aluminum oxide, followed by a sub-layer of aluminum nitride, followed by a sub-layer of silicon nitride. The thickness of layer 710 is about 1000 Angstroms.

Referring to FIG. 7e, a dielectric layer 712 is then formed atop layer 710. Dielectric layer 712 may be, for example, a silicon dioxide layer, and may be formed by chemical vapor deposition. Dielectric layer 712 is deposited to a thickness of about 12,000 Angstroms and is then polished using a chemical mechanical planarization (CMP) process.

According to method step 916, dielectric layer 712 is patterned and etched to form a first opening 712a above the other portions 702b of top surface 702t. First opening 712a extends downward to reveal a portion 708a of the top surface 708t of hard mask layer 708.

Furthermore, dielectric layer 712 is etched to form a second opening 712b above the portions 702a of top surface 702t. Second opening 712b extends downward to reveal a segment 712c of the portions 702a of top surface 702t of bottom electrode layer 702.

Referring to FIG. 7f, an adhesive layer 714 is then conformally deposited. The adhesive layer may be a titanium-containing layer. The adhesive layer may comprise two or more sub-layers (not shown) to provide optimal adhesive properties. The adhesive layer 714 may comprise, for example, a sub-layer of titanium and another sub-layer of titanium nitride. The thickness of the adhesive layer is about 400 Angstroms.

A conductive layer 716 is formed atop the adhesive layer 714. The conductive layer 716 may comprise, for example, tungsten and has a thickness of about 4000 Angstroms. Conductive layer 716 is planarized by a process such as chemical mechanical planarization (CMP) to form conductive features 716a and 716b, the results of which are shown in FIG. 7g and method step 918.

By forming first opening 712a and second opening 712b and subsequently filling first opening 712a and second opening 712b with conductive material, separate contacts are made to bottom electrode layer 702 and to top electrode layer 706 (the latter via hard mask layer 708).

Figure 7H:
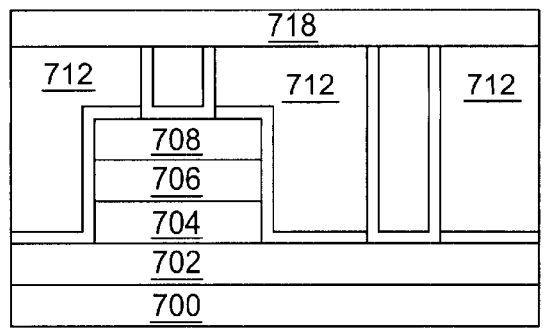
Figure 7I:
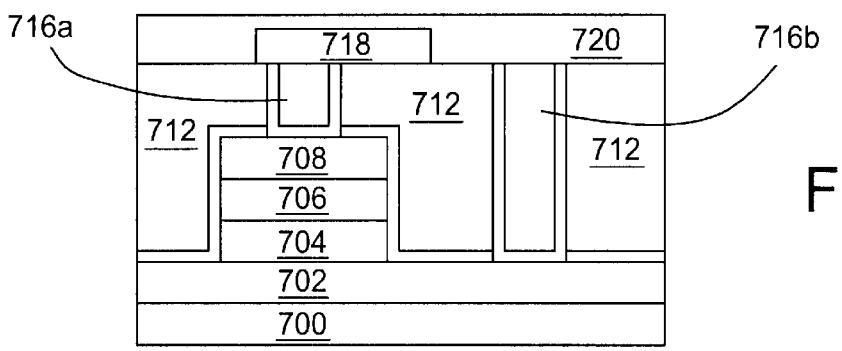

Referring to FIG. 7h and step 920, a resistor layer 718 is then formed. Resistor layer 718 preferably comprises polycrystalline silicon (polysilicon) and has a thickness that is variable, but the thickness is generally in the range of about 1500 Å to about 10,000 Å. The polysilicon may be implanted with a species, such as, for example, arsenic, in order to adjust the conductivity of resistor layer 718. As shown in FIG. 7i, resistor layer 718 is patterned and etched such that the resistor layer contacts conductive feature 716a or conductive feature 716b, but not both. FIG. 7i illustrates resistor layer 718 in contact with conductive feature 716a.

A dielectric layer 720 is then deposited. Dielectric layer 720 may be, for example, a silicon dioxide layer, and may be formed by chemical vapor deposition. Dielectric layer 720 is deposited to a thickness of about 12,000 Angstroms and is then preferably polished using a chemical mechanical planarization (CMP) process.

Figure 7J:
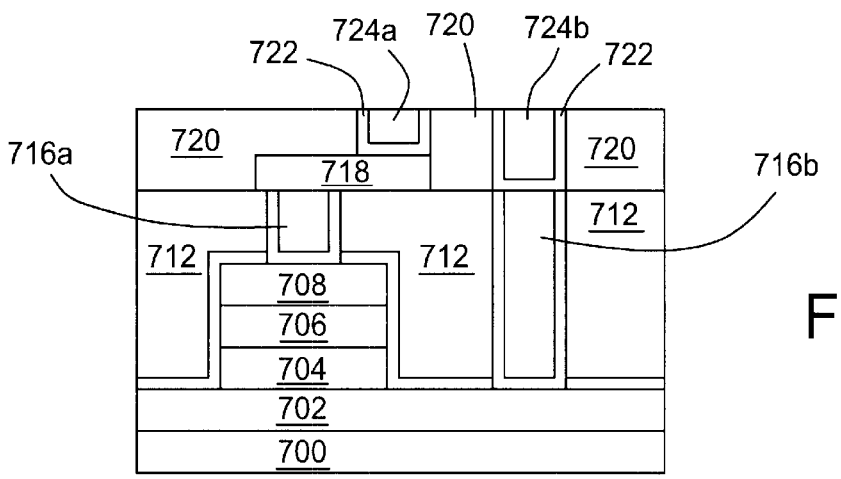

As indicated in FIG. 7j, dielectric layer 720 is patterned and etched to form an opening above resistor layer 718 and a second opening above conductive feature 716b. An adhesive layer 722 is deposited in a fashion similar to adhesive layer 714 is then deposited. A conductive layer (not shown) is then deposited in similar fashion to conductive layer 716. As shown in step 922, the conductive layer is then planarized to form conductive feature 724a, which is formed above resistor layer 718, and conductive feature 724b, which is formed above conductive feature 716b.

Figure 7K:
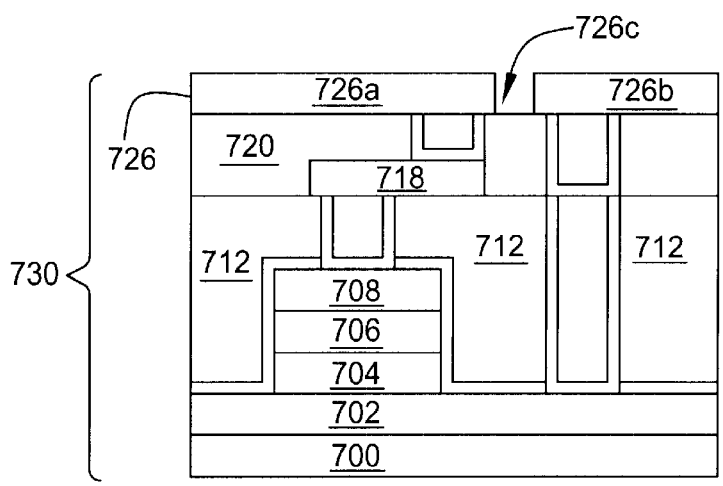

Referring to FIG. 7k, a conductive layer 726 is formed. Conductive layer 726 preferably comprises copper, aluminum, or combinations thereof. Conductive layer 726 has a thickness of about 4000 Angstroms. Optionally, an adhesive layer (not shown) may be deposited prior to the conductive layer 726 to facilitate adhesion between the various material layers. This adhesive layer may be a titanium-containing material. The adhesive layer may comprise one or more sub-layers, such as, for example a sub-layer of titanium and a separate sub-layer of titanium nitride. An opening 726c is formed in conductive layer 726 in order to electrically isolate conductive feature 724a and conductive feature 724b by forming electrically isolated layer 726a and layer 726b. Referring to method step 924, electrically isolated layer 726a serves as a charge collector for the charge monitoring device 730 thus formed.

Charge monitoring device 730 comprises a capacitor defined by bottom electrode layer 702, ferroelectric charge storage layer 704 and top electrode layer 706. The capacitor is in connected in series with resistor layer 720. The capacitor and resistor are generally designed such that the time constant (product of the resistance and capacitance) is less than about one second.

Charge monitoring device 730, illustrated in FIG. 7 is configured with what is commonly termed a common bottom electrode, i.e. charge is not merely conducted from top to bottom in the bottom electrode layer 702, but charge is conducted laterally within bottom electrode layer in order to complete the circuit. It is also within the scope of the present invention to utilize other charge-carrying configurations.

Figure 10:
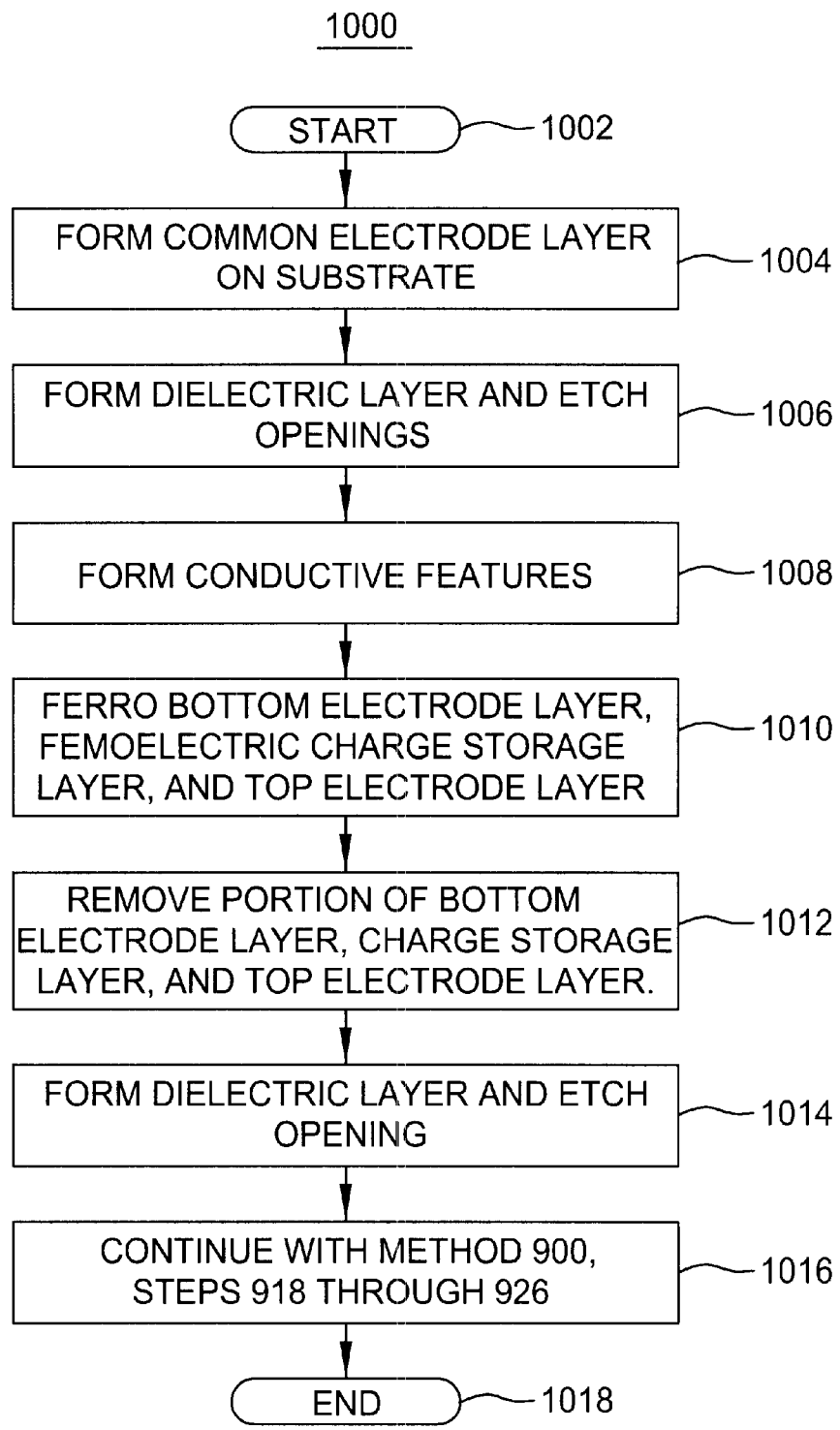
FIG. 10 depicts a series of method steps for making for making the charge monitoring device whose construction is depicted in FIGS. 8a–i.

For example, FIG. 8 depicts an alternate embodiment of the charge monitoring device during various stages of its construction. The corresponding method for forming this embodiment of the charge monitoring device is shown in FIG. 10. Referring to FIG. 10, a series of method steps 1000 begins at step 1002 and proceeds to step 1004 wherein a common electrode layer 802 is formed on a substrate 800. The substrate 800 is of a similar nature to substrate 700, described previously. Optionally, the substrate 800 may comprise an adhesion layer, for example, a titanium-containing layer, in order to promote adhesion between substrate 800 and common electrode layer 802. Common electrode layer 802 has a composition and thickness that is similar to bottom electrode layer 702, described previously. The formation of common electrode layer 802 is shown in FIG. 8a.

Figure 8A:
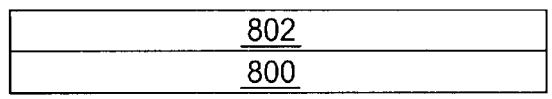
FIGS. 8a–j depict schematic cross-sectional illustrations of a second embodiment of the subject charge monitoring device during the various steps of its construction.
Figure 8B:
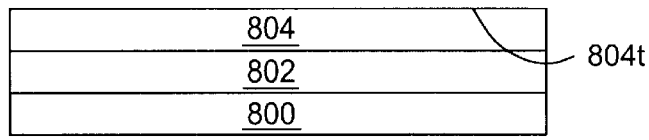
Figure 8C:
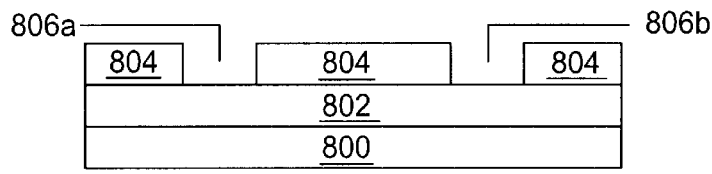

A dielectric layer 804 with a top surface 804t is formed according to step 1006 and shown in FIG. 8b. The dielectric layer may be, for example, silicon oxide, and may have a thickness of about 4000 Angstroms. Portions of dielectric layer 802 are etched to form a first opening 806a and a second opening 806b in dielectric layer 804, as shown in FIG. 8c. The openings expose portions of common electrode layer 802.

Figure 8D:
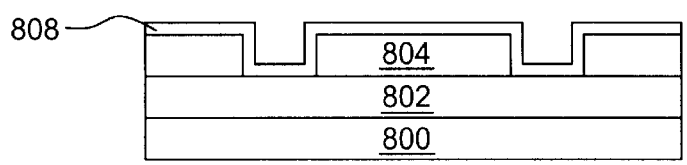
Figure 8E:
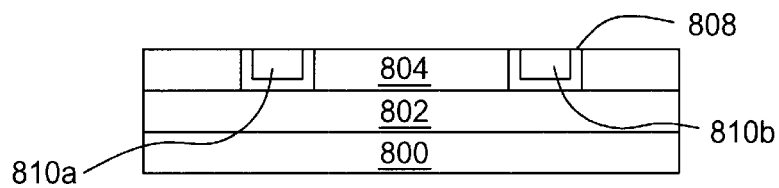

As shown in FIG. 8d, an optional adhesion layer 808 is then formed. Adhesion layer 808 conformally coats dielectric layer 804 and openings 806 therethrough. The adhesion layer 808 may comprise, for example, a titanium-containing material. Conductive material is provided to opening 806a and opening 806b by forming a conductive layer (not shown) atop the adhesion layer 808. First conductive feature 810a and second conductive feature 810b are formed, using a process such as, for example, CMP, as shown in FIG. 8e and in step 1008. Conductive layer has a composition similar to conductive layer 716 discussed previously.

Figure 8F:
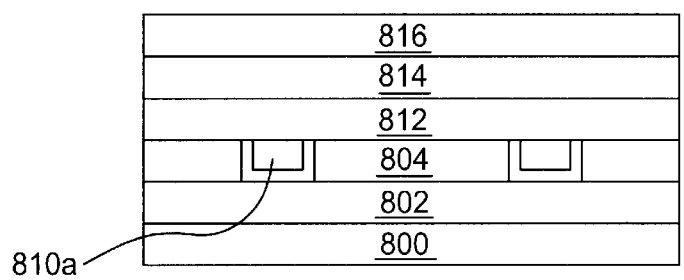
Figure 8G:
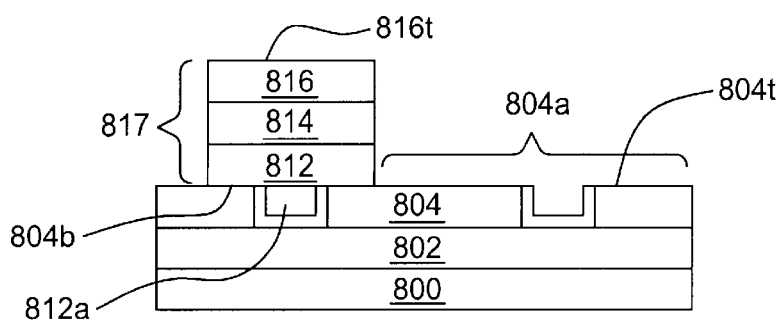

Sequentially, a bottom electrode layer 812, a ferroelectric charge storage layer 814, and a top electrode layer 816 are formed atop over conductive features 810 and atop openings 806a and 806b, as shown in FIG. 8f and step 1010. Top electrode layer 816 has a top surface 816t. Bottom electrode layer 812, ferroelectric charge storage layer 814, and top electrode layer 816 are similar to those layers used to form charge monitoring device 730, depicted in FIG. 7. Portions of bottom electrode layer 812, ferroelectric charge storage layer 814, and top electrode layer 816 are removed as shown in FIG. 8g and step 1012, thereby exposing portions 804a of a top surface 804t of dielectric layer 804. Other portions 804b of top surface 804t and conductive feature 810a remain in contact with bottom electrode layer 812.

Figure 8H:
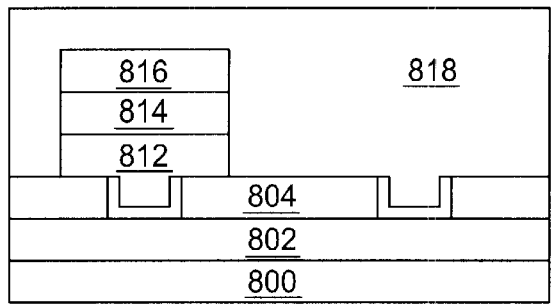
Figure 8I:
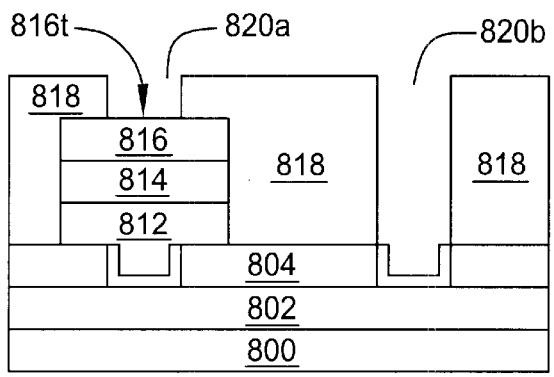

Referring to step 1014 and FIG. 8h, a second dielectric layer 818 is then formed. Second dielectric layer 818 is similar in composition and thickness to dielectric layer 712. A first opening 820a and a second opening 820b are etched into dielectric layer 818 in order to form contacts to top electrode layer 816 and common electrode layer 802, as shown in FIG. 8i.

Figure 8J:
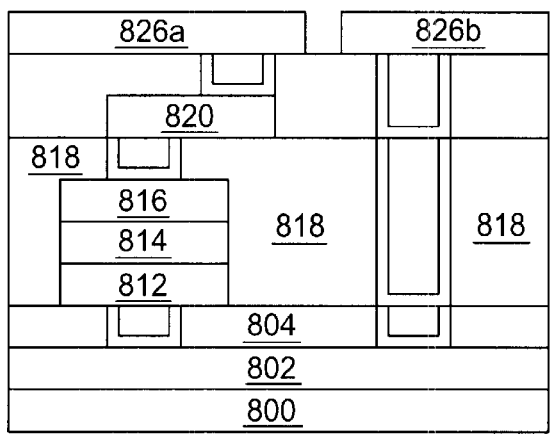

As indicated in step 1016 in FIG. 10, the method continues with step 918 through step 926 of method 900 in order to complete the construction of the charge monitoring device 830, shown in FIG. 8j. Charge monitoring device comprises resistor layer 820, electrically isolated layer 826a, and electrically isolated layer 826b. Resistor layer 820, electrically isolated layer 826a, and electrically isolated layer 826b are similar to resistor layer 718, electrically isolated layer 726a and electrically isolated layer 726b, respectively.

Referring to FIG. 11, and step 926 of FIG. 9, one or more optional additional material layers may be formed atop electrically isolated layer (the charge collector) to promote charge collection and to simulate particular semiconductor processes. In one embodiment, the one or more layers formed atop the charge collector are electrically non-conductive. Layer 1126a is a charge collector, similar to electrically isolated layer 726a and electrically isolated layer 826a. Layer 1126a is electrically conductive and preferably comprises copper, aluminum, or combinations thereof.

Figure 11A:
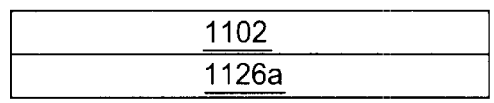
FIGS. 11a–e depict schematic cross-sectional illustrations of the construction of a charge collector that may be used with the charge monitoring device of the present invention.

Referring to FIG. 11a, in one embodiment, a photoresist layer 1102 is formed atop layer 1126. Layer 1102 may comprise any number of photoresists commonly used in the art of semiconductor or thin film lithographic processing. The configuration depicted in FIG. 11a is particularly useful for assessing charge accumulation during photoresist ashing processes.

Figure 11B:
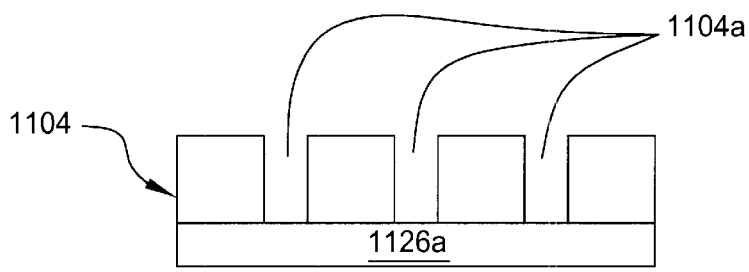

Referring to FIG. 11b, in another embodiment, a patterned dielectric 1104 is formed atop layer 1126a. Patterned dielectric 1104 may comprise a materials such as silicon dioxide or other dielectric materials commonly used in semiconductor or thin film processing. Patterned dielectric 1104 has a plurality of openings 1104a therethrough. This configuration is particularly useful for assessing charge accumulation during dielectric etch processes or PVD metal deposition processes.

Figure 11C:
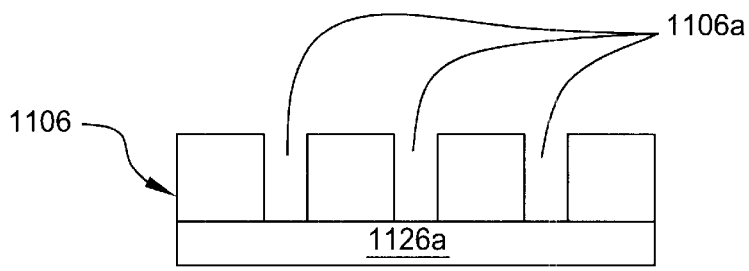

Referring to FIG. 11c, in another embodiment, a patterned photoresist layer 1106 is formed above layer 1126a. Patterned photoresist layer 1106 has a plurality of openings 1106a therethrough. This configuration is particularly useful for assessing charge accumulation during dielectric etch processes, silicon etch processes, or metal etch processes.

Figure 11D:
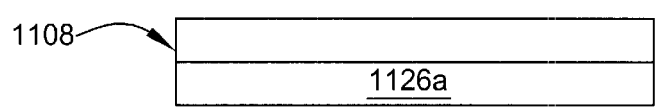

Referring to FIG. 11d, in another embodiment, an unpatterned dielectric layer 1108 is formed above layer 1126a. This configuration is particularly useful for assessing charge accumulation during dielectric etch processes, silicon etch processes, metal etch processes, plasma enhanced chemical vapor deposition of dielectrics, and high density plasma (HDPCVD)

Figure 11E:
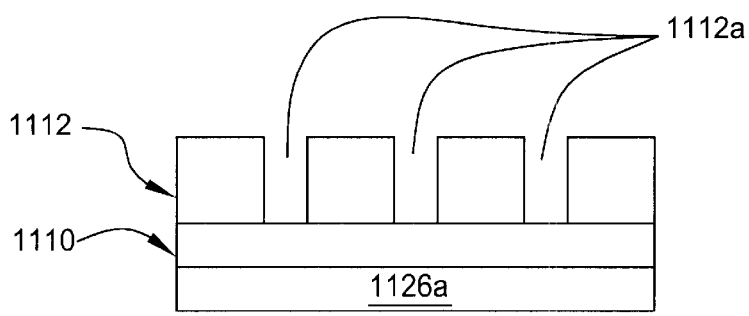

Referring to FIG. 11e, in yet another embodiment, an unpatterned dielectric layer 1110 is formed above layer 1126a, and a patterned dielectric layer 1112 is formed atop dielectric layer 1110. Patterned dielectric 1112 has a plurality of openings 1112a therethrough. This configuration is particularly useful for assessing charge accumulation during dielectric etch processes.

While FIG. 7a to FIG. 7k shows the formation of a single capacitor-resistor pair, it is within the scope of the invention to use the process techniques thus described to form an array of capacitor-resistor pairs. The array of capacitor-resistor pairs may be formed in a configuration so as to create an array or plurality of capacitor-resistor pairs similar to those discussed in FIG. 6.

Furthermore, one skilled in the art may readily devise combinations of conductive layers, resistor layers, and ferroelectric charge storage layers, adhesive layers, dielectric layers, other than those discussed in FIG. 7 and FIG. 8 as well as other embodiments that still incorporate these teachings.

Figure 14:
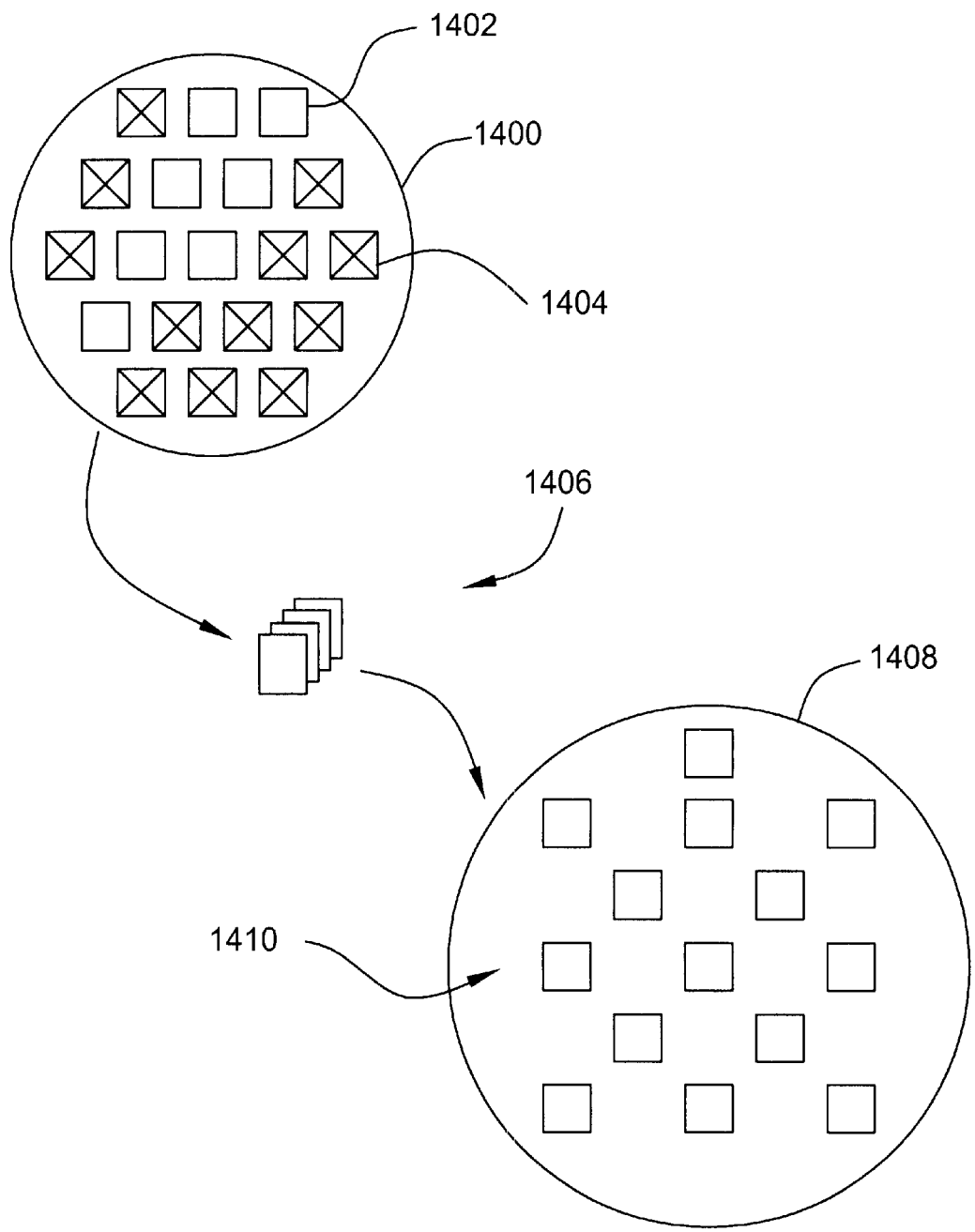
FIG. 14 depicts a process for fabricating an array of charge monitoring devices.

In instances where the number of operational charge monitoring devices formed on a substrate is low, the dies on the substrate that contain one or more operational devices can be removed (cut or cleared) from the substrate. FIG. 14 depicts a substrate 1400 having a plurality of "good" dies (white boxes 1402) and a plurality of "bad" dies (x-boxes 1404). The removed "good" dies are shown at reference number 1406. These removed dies 1406 can be affixed (bonded) to another (second) substrate 1408 such as a blanket silicon wafer. The devices can be bonded to the second substrate 1408 using an epoxy. As such, the devices can be positioned in a specific pattern to form an array 1410 to best monitor a plasma. The pattern can be tailored to a particular chamber and/or process.

PROCESS OF MEASURING CHARGE ACCUMULATION

Figure 12:
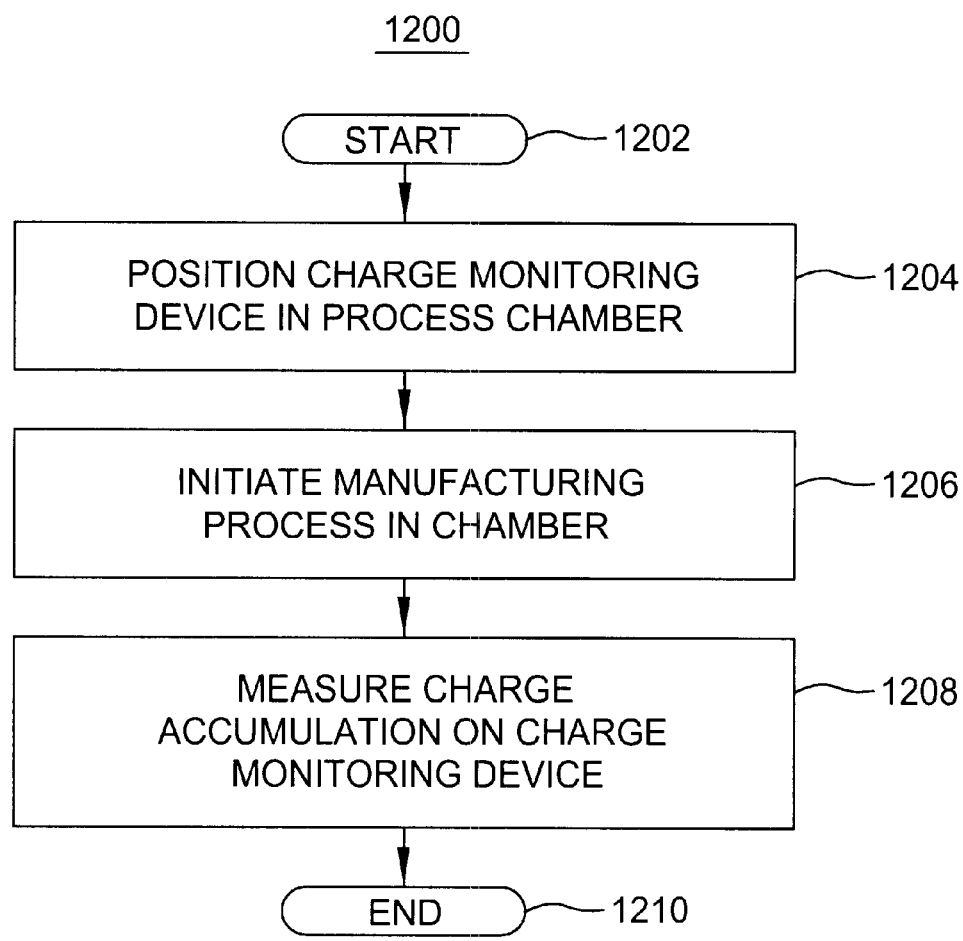
FIG. 12 depicts a series of method steps for monitoring charge accumulation in a process chamber.

The charge monitoring device of the present invention is used to measure charge accumulation on a semiconductor wafer or workpiece. A method for forming the charge monitoring device is depicted in FIG. 12. A series of method steps 1200 begins at step 1202 and proceeds to step 1204 wherein a charge monitoring device is positioned in a semiconductor wafer processing chamber, such as, for example, etch chamber 200. However, the charge monitoring device may be positioned in any wafer processing chamber that is capable of providing charge to the charge monitoring device. Other examples of chambers, include PECVD chambers, RIE chambers, IMP chambers, ion implantation chambers as well as other processing chambers that are capable of subjecting a workpiece to a plasma or charged beam.

The charge monitoring device comprises one or more capacitor resistor pairs. The one or more capacitor-resistor pairs are typically characterized as having a threshold voltage. If the capacitor-resistor pair is exposed to a voltage of a magnitude greater than the threshold voltage and with a polarity opposite to the existing polarity, the ferroelectric charge storage material within the capacitor will switch polarization states.

Referring to step 1206, a process is initiated in the chamber and charge is accumulated on the charge monitoring device. Once the process or a portion thereof is completed, the charge monitoring device 300 is then removed from the chamber, and the charge that has accumulated on the charge monitoring device 300 is then measured, as shown in step 1208. The charge monitoring device is preferably electrically connected to an external circuit that is capable of quantifying the charge that has developed on the charge monitoring device after exposure to the process. The method ends with step 1210.

The external circuit comprises a sense amplifier that is capable of reading the polarization state of the one or more capacitors within the charge monitoring device. Sense amplifiers are well known in the art and typically function by examining currents that are delivered to a load resistor when the sense amplifier is electrically coupled to the device or component whose polarization state must be read. The reading of the polarization state may be through a destructive process in which the polarization state of the ferroelectric charge storage layer is altered in order to read the polarization state. Alternatively, the read process can be non-destructive where the charge is available for repeated reading. Once the charge is accurately read, the capacitor is "reprogrammed" to its initial state.

By comparing the final polarization state of the ferroelectric charge storage layer within one or more capacitors to the original polarization state of the corresponding ferroelectric charge storage layer within one or more capacitors, one may determine which of the ferroelectric charge storage layers within the one or more capacitors changed polarization state.

Using the process of determining the polarization states as described above reveals a number of capacitors that have switched polarization state and a number of capacitors that have not switched polarization state. One may estimate the voltage that has been applied to the charge monitoring device by examining the threshold voltage of those capacitors that have switched versus those that have not switched. One then concludes that the applied voltage from the process sequence is less than the threshold voltages for those capacitors that have not switched, and greater than for those capacitors that have switched. Using this method, one uses the charge monitoring device as an analog to digital converter to bracket the applied voltage that has arisen from the process sequence. The voltage thus determined may be easily converted to accumulated charge through mathematical calculations familiar to those skilled in the art.

If the amount of charge that has accumulated on charge monitoring device is above a certain predetermined value, for example, various corrective actions may be taken. For example, one or more process variables may be adjusted in order reduce the degree of charge accumulation from the plasma or charged beam in chamber 200.

The charge monitoring device may be reprogrammed by applying a reprogramming voltage to the one or more capacitors in order to adjust the polarization state of the ferroelectric charge storage material within the one or more capacitors. In this manner, one may return the one or more capacitors to the same polarization state to facilitate the reuse the device.

Figure 13:
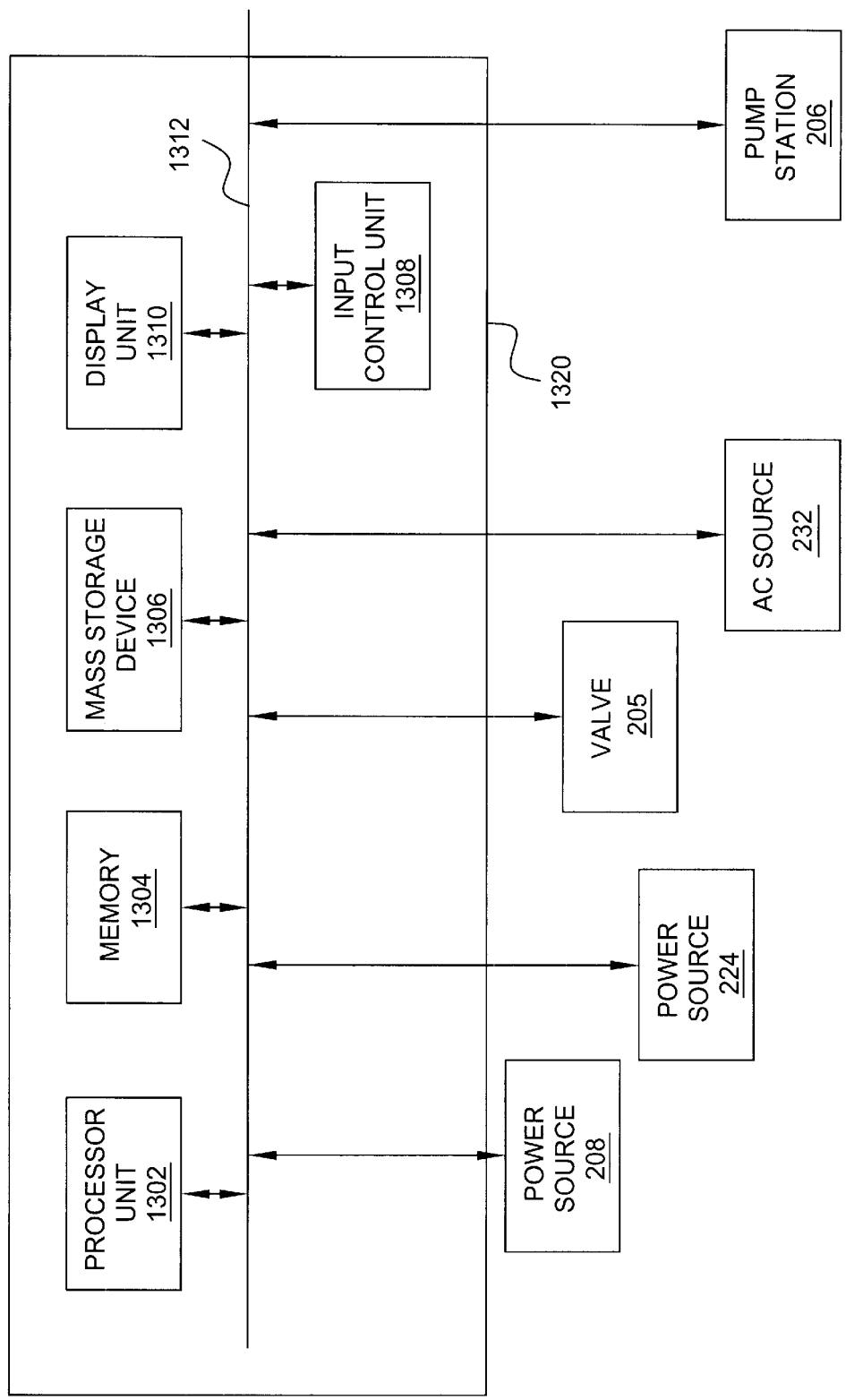
FIG. 13 depicts a block diagram of a process control system of the subject invention.

The above-described process 1200 for measuring charge accumulation can be performed in a system that is controlled by a process control system 1320, as shown in FIG. 13. FIG. 13 shows a detailed block diagram of the process control system 1320 that can be employed in such a capacity. The process control system 1320 includes a processor unit 1302, a memory 1304, a mass storage device 1306, an input control unit 1308, and a display unit 1310 which are all coupled to a control unit bus 1312.

The processor unit 1302 forms a general purpose computer that becomes a specific purpose computer when executing programs such as a program for measuring charge accumulation. Although the invention is described herein as being implemented in software and executed upon a general purpose computer, those skilled in the art will realize that the method of the present invention could be operated using hardware such as an application specific integrated circuit (ASIC) or other hardware circuitry. As such, the invention should be understood as being able to be implemented, in whole or in part, in software, hardware or both.

The processor unit 1302 is either a microprocessor or other engine that is capable of executing instructions stored in a memory. The memory 1304 can be comprised of a hard disk drive, random access memory ("RAM"), read only memory ("ROM"), a combination of RAM and ROM, or another processor readable storage medium. The memory 1304 contains instructions that the processor unit 1302 executes to facilitate the performance of the above mentioned process steps. The instructions in the memory 1304 are in the form of program code. The program code may conform to any one of a number of different programming languages. For example, the program code can be written in C+, C++, BASIC, Pascal, or a number of other languages.

The mass storage device 1306 stores data and instructions and retrieves data and program code instructions from a processor readable storage medium, such as a magnetic disk or magnetic tape. For example, the mass storage device 1306 can be a hard disk drive, floppy disk drive, tape drive, or optical disk drive. The mass storage device 1306 stores and retrieves the instructions in response to directions that it receives from the processor unit 1302. Data and program code instructions that are stored and retrieved by the mass storage device 1306 are employed by the processor unit 1302 for performing the above mentioned process steps. The data and program code instructions are first retrieved by the mass storage device 1306 from a medium and then transferred to the memory 1306 for use by the processor unit 1302.

The display unit 1310 provides information to a chamber operator in the form of graphical displays and alphanumeric characters under control of the processor unit 1302. The input control unit 1308 couples a data input device, such as a keyboard, mouse, or light pen, to the system 1320 to provide for the receipt of a chamber operator' inputs.

The control unit bus 1312 provides for the transfer of data and control signals between all of the devices that are coupled to the control unit bus 1312. Although the control unit bus is displayed as a single bus that directly connects the devices in the system 1320, the control unit bus 1312 can also be a collection of busses. For example, the display unit 1310, input system 1308 and mass storage device 1306 can be coupled to an input-output peripheral bus, while the processor unit 1302 and memory 1304 are coupled to a local processor bus. The local processor bus and input-output peripheral bus are coupled together to form the control unit bus 1312.

The process control system 1320 is coupled to various elements of a process chamber, such as, for example, process chamber 200 detailed in FIG. 3, employed in a film deposition process in accordance with the present invention. Each of the elements is coupled to the control unit bus 1312 to facilitate communication between the system 1320 and the element. These elements include but are not limited to the following: valve 205, power source 208, power source 224, AC source 232, and pump system 206. The control system 1320 provides signals to the chamber elements that cause the elements to perform the operations described above for the process steps of controlling deposition chamber 200.

In operation, the processor unit 1302 directs the operation of the chamber elements in response to the program code instructions that it retrieves from the memory 1304. In response to these instructions, the chamber elements are directed to perform the etch process steps.

The ferroelectric charge storage layer enables the charge storage device to maintain a memory of the charge that has accumulated on the device during charging. This memory is not degraded or erased when the device is removed from the process chamber. The resistors that comprise the capacitor-resistor pairs of the charge monitoring device provide the function of determining the threshold voltage at which the capacitor-resistor pair will switch polarization states. The use of multiple capacitor-resistor pairs allows the charge monitoring device to act as an analog-digital converter to determine the applied voltage and the charge accumulation on the charge monitoring device. The charge monitoring device of the present invention is capable of measuring a voltage in the range of about 1 volt to about 100 volts.

The charge monitoring device 300 is particularly advantageous in that it is easy to fabricate, especially compared to prior art charge monitoring devices that comprise transistor elements. Charge monitoring device 300 does not comprise transistor elements, which are typical in devices used for charge monitoring in semiconductor process chambers.

Although various embodiments which incorporate the teachings of the present invention have been shown and described in detail herein, those skilled in the art can readily devise many other varied embodiments that still incorporate these teachings.

What is claimed is:

1. A charge monitoring device comprising a capacitor-resistor pair having a resistor connected in series with a capacitor, said capacitor having a ferroelectric charge storage layer.

2. The charge monitoring device of claim 1 wherein the charge monitoring device is capable of sensing a voltage in the range of about 1 volt to about 100 volts.

3. The charge monitoring device of claim 1 wherein one or more capacitor-resistor pairs have a time constant of less than about 1 second.

4. The charge monitoring device of claim 1 wherein the ferroelectric charge storage layer comprises a material selected from the group consisting of: ceramic materials, polymeric materials, and ceramic polymer composite materials.

5. The charge monitoring device of claim 4 wherein the ferroelectric charge storage layer comprises at least one element selected from the group consisting of: oxygen, barium, strontium, titanium, lead, lanthanum, zirconium, titanium, magnesium, potassium, niobium, lithium, calcium, bismuth, tantalum.

6. The charge monitoring device of claim 4 wherein the ferroelectric charge storage layer comprises a material selected from the group consisting of: barium titanate, barium strontium titantate, lead titanate, lead lanthanum zirconate titanate, lead zirconate titanate, lead magnesium niobate, potassium niobate, potassium sodium niobate, calcium titantate, bismuth titanate, lead bismuth niobate, lithium niobate, lithium tantalate and combinations thereof.

7. The charge monitoring device of claim 1 wherein the ferroelectric charge storage layer is formed by metal-organic chemical vapor deposition.

8. The charge monitoring device of claim 1 wherein the one or more resistors comprise polycrystalline silicon.

9. The charge monitoring device of claim 1 wherein the charge monitoring device comprises a plurality of capacitor-resistor pairs, connected in parallel with one another.

10. The charge monitoring device of claim 1 further comprising a charge collector comprising a conductive layer, wherein the conductive layer is comprised of a material selected from the group consisting of aluminum, copper, and combinations thereof.

11. The charge monitoring device of claim 10 wherein one or more material layers are formed atop the charge collector.

12. The charge monitoring device of claim 11 wherein the one or more material layers are selected from the group consisting of a photoresist layer, a dielectric layer, and combinations thereof.

13. The charge monitoring device of claim 11 wherein the one or more material layers comprise a layer with openings therethrough.

14. The charge monitoring device of claim 1 further comprising a bottom electrode layer and an top electrode layer in contact with the ferroelectric charge storage layer, wherein the bottom electrode layer comprises a material selected from the group consisting of platinum, iridium, or combinations thereof.

15. The charge monitoring device of claim 1 further comprising a bottom electrode layer and a top electrode layer in contact with the ferroelectric charge storage layer, wherein the top electrode layer comprises a material selected from the group consisting of platinum, iridium, or combinations thereof.

16. The charge monitoring device of claim 15, wherein the bottom electrode layer is a shared common electrode.

* * * * *